United States Patent
Wu et al.

(10) Patent No.: US 9,362,001 B2
(45) Date of Patent: Jun. 7, 2016

(54) MEMORY CELL CAPABLE OF OPERATING UNDER LOW VOLTAGE CONDITIONS

(71) Applicant: eMemory Technology Inc., Hsin-Chu (TW)

(72) Inventors: Meng-Yi Wu, Hsinchu County (TW); Chih-Hao Huang, Taichung (TW); Hsin-Ming Chen, Hsinchu (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 14/798,478

(22) Filed: Jul. 14, 2015

(65) Prior Publication Data

US 2016/0104542 A1    Apr. 14, 2016

Related U.S. Application Data

(60) Provisional application No. 62/063,410, filed on Oct. 14, 2014.

(51) Int. Cl.
  *G11C 17/18*   (2006.01)
  *G11C 17/16*   (2006.01)
  *G11C 29/00*   (2006.01)

(52) U.S. Cl.
  CPC ............... *G11C 17/18* (2013.01); *G11C 17/16* (2013.01); *G11C 29/785* (2013.01)

(58) Field of Classification Search
  CPC ....... G11C 17/18; G11C 17/16; G11C 29/785
  USPC ............................................... 365/225.7, 104
  See application file for complete search history.

(56) References Cited

U.S. PATENT DOCUMENTS

| | | |
|---|---|---|
| 6,157,568 A | 12/2000 | Schmidt |
| 6,466,482 B2 | 10/2002 | Shukuri |
| 7,173,851 B1 | 2/2007 | Callahan |
| 7,239,558 B1 | 7/2007 | Poplevine |
| 8,331,126 B2 | 12/2012 | Terzioglu |
| 8,530,283 B2 | 9/2013 | Agam |
| 8,611,144 B2 | 12/2013 | Terzioglu |
| 8,724,364 B2 | 5/2014 | Agam |
| 8,803,282 B2 | 8/2014 | Agam |
| 2008/0117660 A1 | 5/2008 | Xu |
| 2008/0165564 A1 | 7/2008 | Namekawa |
| 2009/0235040 A1 | 9/2009 | Chilumula |
| 2013/0062698 A1 | 3/2013 | Agam |
| 2014/0104921 A1 | 4/2014 | Yu |
| 2014/0340955 A1* | 11/2014 | Wu ............... H01L 27/11206 365/104 |
| 2015/0008496 A1 | 1/2015 | Chakrabartty |

* cited by examiner

*Primary Examiner* — Jason Lappas
(74) *Attorney, Agent, or Firm* — Winston Hsu; Scott Margo

(57) ABSTRACT

A memory cell includes a programming selection transistor, a following gate transistor, an antifuse element, and a reading circuit. A charging current formed by the antifuse element may trigger the reading circuit to form a stable read current during a reading operation of the memory cell so that the time for reading data from the memory cell can be shortened. A discharging process may be operated in the beginning of the reading operation of the memory cell so that the window of time for reading data from the memory cell can be widened.

24 Claims, 11 Drawing Sheets

MEMORY CELL CAPABLE OF OPERATING UNDER LOW VOLTAGE CONDITIONS

CROSS REFERENCE TO RELATED APPLICATIONS

This non-provisional application claims priority of US provisional application U.S. 62/063,410, filed on Oct. 14, 2014, included herein by reference in its entirety.

BACKGROUND OF THE INVENTION

1. Field of the Invention

This invention relates to a memory cell, and more particularly, a memory cell that can operate under low voltage conditions.

2. Description of the Prior Art

Non-volatile memory (NVM) is a type of memory that retains information it stores even when no power is supplied to memory blocks. FIG. 1 shows a memory array 100 according to prior art. The memory array 100 includes a plurality of memory cells 110A, 110B, and 110C disposed in rows and columns. Each memory cell 110A, 110B, and 110C comprises a transistor 112 and an antifuse transistor 114. Memory cells 110A and 110B disposed in the same row (within same word) receive the same word line selection signal WS1, program control signal PC1 and program data signal PD1 but different bit line selection signals BS1 and BS2. Memory cells 110A and 110C disposed in the same column receive the same bit line selection signal BS1 but different word line selection signals WS1 and WS2, program control signals PC1 and PC2, and program data signals PD1 and PD2.

During the programming operation of the memory cell 110A, the antifuse transistor 114 of the memory cell 110A is ruptured and functions as a MOS capacitor, such that data of logic "1" is written into the memory cell 110A. During the reading operation of the memory cell 110A, the corresponding word line selection signal WS1 received by the memory cell 110A is at a high voltage and the corresponding bit line selection signal BS1 received by the memory cell 110A is at a low voltage so the transistor 112 of the memory cell 110A can be turned on accordingly. Thus, the transistor 112 of the memory cell 110A can form a read current according to the data stored in the antifuse transistor 114 of the memory cell 110A. And the system then can determine the data by the amount of the read current.

However, since the second terminal of the transistor 112 of the memory cells disposed in the same column, such as memory cells 110A and 110C, are coupled together, the read current must charge the parasitic capacitors of all the other memory cells along the column directly. Since the read current formed by the antifuse transistor 114 may be rather small, the long charging path along the column may cause significant decay, increasing the time for reading data from the memory cell 110A. This situation may get even worse when the memory cell is operated with low voltage.

SUMMARY OF THE INVENTION

One embodiment of the present invention discloses a memory cell for low voltage operations. The memory cell includes a programming selection transistor, a following gate transistor, an antifuse element (e.g. varactor), and a reading circuit. The programming selection transistor may have a first terminal, a second terminal for receiving a bit line program signal, and a control terminal for receiving a word line program signal. The following gate transistor may have a first terminal, a second terminal coupled to the first terminal of the programming selection transistor, and a control terminal for receiving a following control signal. The antifuse element may have a first terminal for receiving an antifuse control signal, and a second terminal coupled to the first terminal of the following gate transistor. The reading circuit may be coupled to the second terminal of the following gate transistor and configured to form a read current according to a bit line read signal and a selection signal during a reading operation of the memory cell. During the reading operation of the memory cell, the bit line program signal may be at a first voltage, the word line program signal may change from a second voltage to the first voltage, the following control signal may be at the second voltage, the antifuse control signal may beat the second voltage, the bit line read signal may be at the second voltage, the selection signal may be at the first voltage, and the second voltage is higher than the first voltage.

Another embodiment of the present invention discloses a memory array. The memory array may include a first memory cell and a second memory cell. The first memory cell may include a first programming selection transistor, a first following gate transistor, a first antifuse element (e.g. varactor), and a first reading circuit. The first programming selection transistor may have a first terminal, a second terminal for receiving a first bit line program signal, and a control terminal for receiving a first word line program signal. The first following gate transistor may have a first terminal, a second terminal coupled to the first terminal of the first programming selection transistor, and a control terminal for receiving a first following control signal. The first antifuse element may have a first terminal for receiving a first antifuse control signal, and a second terminal coupled to the first terminal of the first following gate transistor. The first reading circuit may be coupled to the second terminal of the first following gate transistor and configured to form a first read current according to a first bit line read signal and a first selection signal during a reading operation of the first memory cell. The second memory cell may include a second programming selection transistor, a second following gate transistor, a second antifuse element (e.g. varactor), and a second reading circuit. The second programming selection transistor may have a first terminal, a second terminal for receiving a second bit line program signal, and a control terminal coupled to the control terminal of the first programming selection transistor. The second following gate transistor may have a first terminal, a second terminal coupled to the first terminal of the second programming selection transistor, and a control terminal coupled to the control terminal of the first following gate transistor. The second antifuse element may have a first terminal coupled to the first terminal of the first antifuse element, and a second terminal coupled to the first terminal of the second following gate transistor. The second reading circuit may be coupled to the second terminal of the second following gate transistor and configured to form a second read current according to a second bit line read signal and a second selection signal during a reading operation of the second memory cell. During the reading operation of the first memory cell, the first bit line program signal may be at a first voltage, the first word line program signal may change from a second voltage to the first voltage, the first following control signal may be at the second voltage, the first antifuse control signal may be at the second voltage, the first bit line read signal may be at the second voltage, the first selection signal may be at the first voltage, the second bit line program signal may be at the first voltage, the second bit line read signal may be at the first voltage, the second selection signal may be at the first voltage, and the second voltage is higher than the first voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
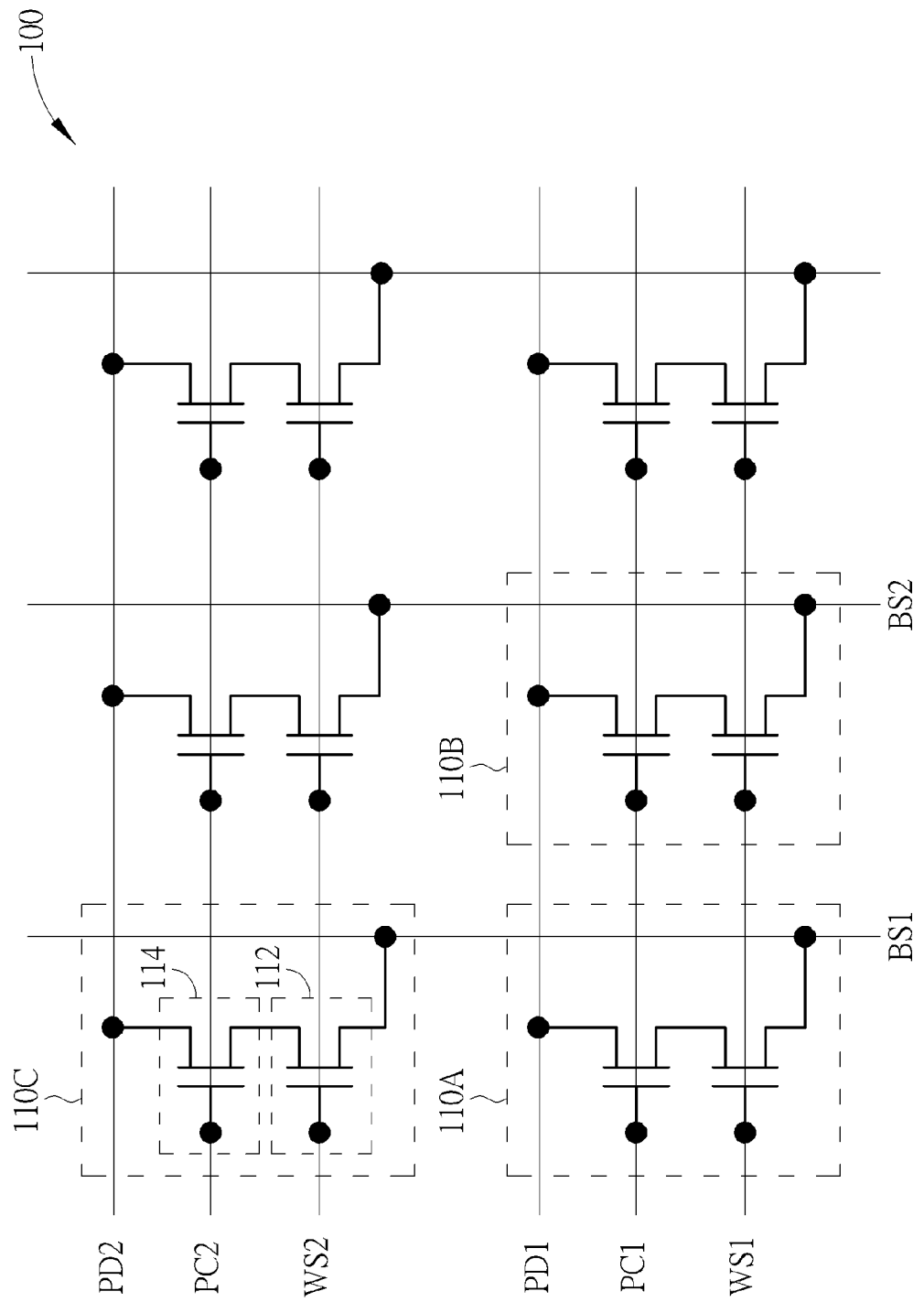
FIG. 1 shows a memory array according to prior art.
Figure 2:
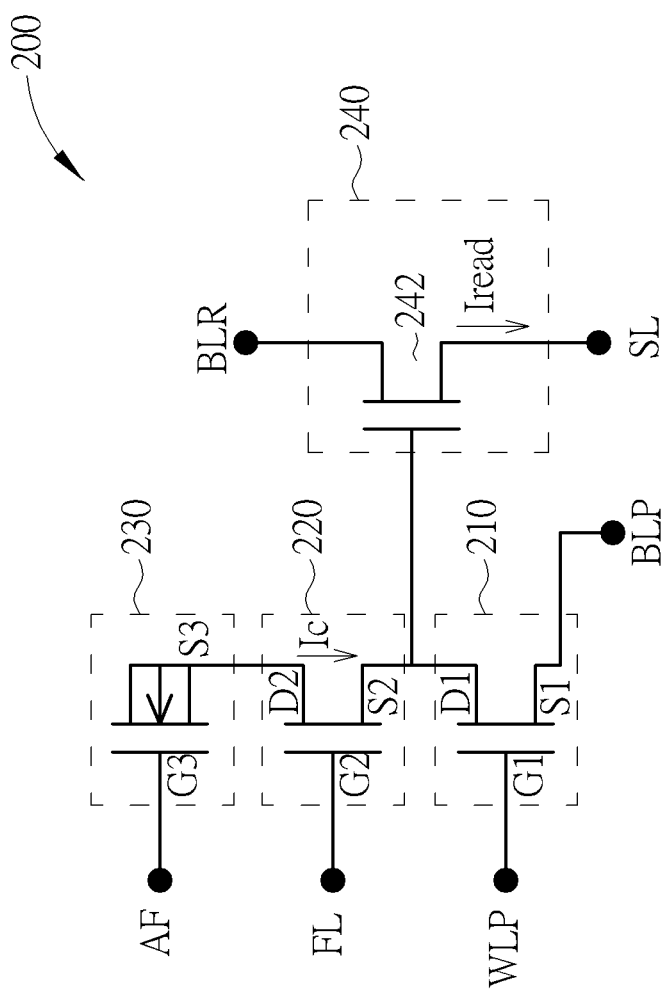
FIG. 2 shows a memory cell according to one embodiment of the present invention.

FIG. 2 shows a memory cell 200 for low voltage operations according to one embodiment of the present invention. The memory cell 200 includes a programming selection transistor 210, a following gate transistor 220, an antifuse varactor 230 (antifuse element), and a reading circuit 240.

The programming selection transistor 210 may have a first terminal D1, a second terminal S1 for receiving a bit line program signal BLP, and a control terminal G1 for receiving a word line program signal WLP. The following gate transistor 220 may have a first terminal D2, a second terminal S2 coupled to the first terminal D1 of the programming selection transistor 210, and a control terminal G2 for receiving a following control signal FL. The antifuse varactor 230 may have a first terminal G3 for receiving an antifuse control signal AF, and a second terminal S3 coupled to the first terminal D2 of the following gate transistor 220. The reading circuit 240 may be coupled to the second terminal S2 of the following gate transistor 220 to form a read current $I_{read}$ according to a bit line read signal BLR and a selection signal SL during a reading operation of the memory cell 200.

Figure 3:
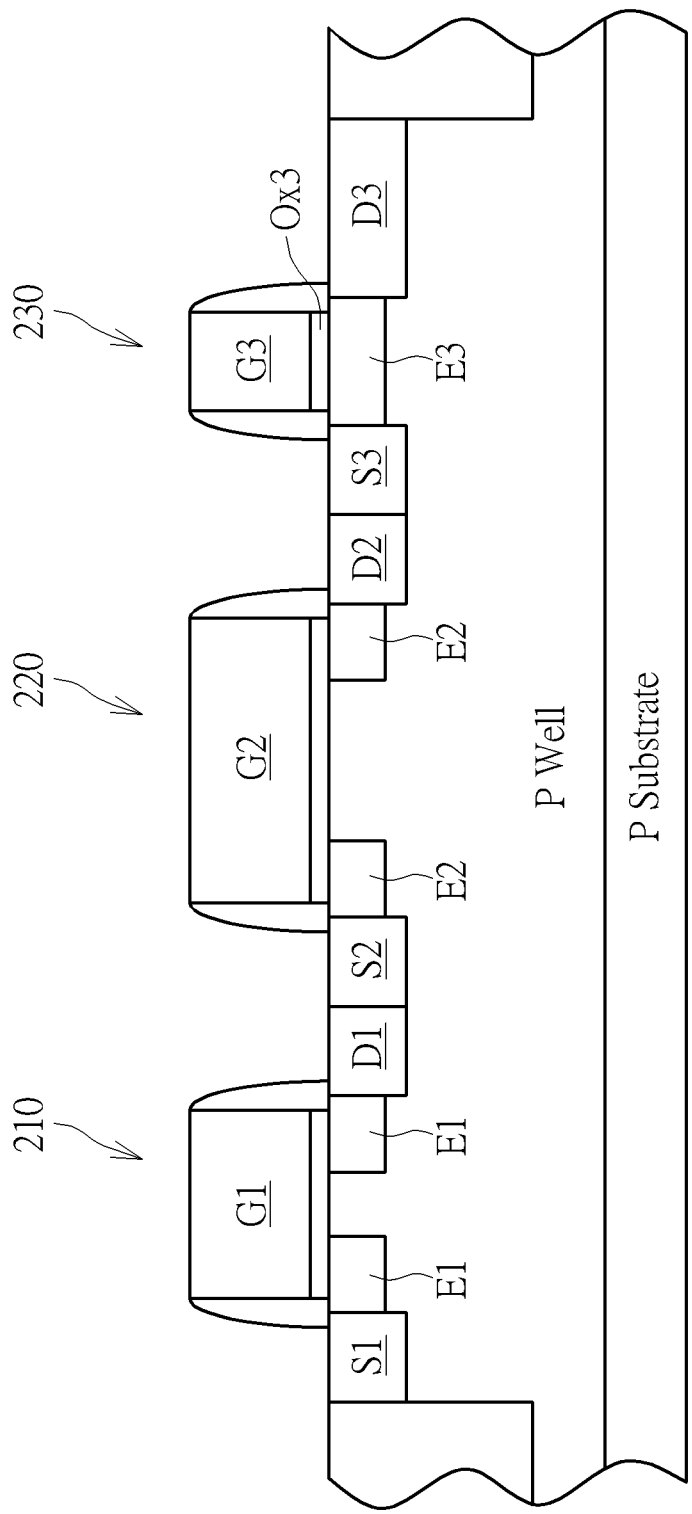
FIG. 3 shows a structure of the memory cell in FIG. 2 according to one embodiment of the present invention.

FIG. 3 shows a structure of the programming selection transistor 210, the following gate transistor 220 and the antifuse varactor 230 according to one embodiment of the present invention. In FIG. 3, the programming selection transistor 210, the following gate transistor 220 and the antifuse varactor 230 may be disposed on a P well formed on a P substrate. The antifuse varactor 230 may be a metal oxide semiconductor transistor having a source/drain extension area E3 formed between the source S3 of the metal oxide semiconductor transistor, that is, the second terminal S3 of the antifuse varactor 230, and the drain D3 of the metal oxide semiconductor transistor for shorting the source S3 and the drain D3 of the metal oxide semiconductor transistor. In this case, the first terminal G3 of the antifuse varactor 230 would be the gate G3 of the metal oxide semiconductor transistor. Since the gate G3 of the metal oxide semiconductor transistor is formed right above the third source/drain extension area E3, the antifuse varactor 230 may be formed without channel and the oxide Ox3 of the antifuse varactor 230 may be ruptured properly during the programming operation. However, the antifuse varactor 230 of the present invention is not limited to the structure shown in FIG. 3. In other embodiments of the present invention, the antifuse varactor 230 may also be formed by other structures.

Moreover, in some embodiments of the present invention, since the memory cell 200 is designed for low voltage read operation, the threshold voltage of the following gate transistor 220 is better reduced. Thus the following gate transistor may be implemented by a native device, a short channel device or a varactor. However, the present invention is not limited to the aforementioned examples.

Furthermore, in some embodiments of the present invention, since the programming selection transistor 210 may be operated with core devices and the antifuse varactor 230 may be operated with I/O devices, the depth of the source/drain extension area E3 may be deeper than the depth of the source/drain extension area E1 so that the antifuse varactor 230 is able to endure higher voltage with the I/O devices. Also, the source/drain extension area E2 that is closer to the first terminal D2 of the following gate transistor 220 may have the same depth as the depth of the source/drain extension area E3, and the source/drain extension area E2 that is closer to the second terminal S2 of the following gate transistor 220 may have the same depth as the depth of the source/drain extension area E3 or the depth of the source/drain extension area E1. However, the present invention is not limited to the aforementioned depths.

In some embodiments of the present invention, the reading circuit 240 may include a reading transistor 242. The reading transistor 242 may have a first terminal for receiving the bit line read signal BLR, a second terminal for receiving the selection signal SL, and a control terminal coupled to the second terminal S2 of the following gate transistor 220.

Figure 4:
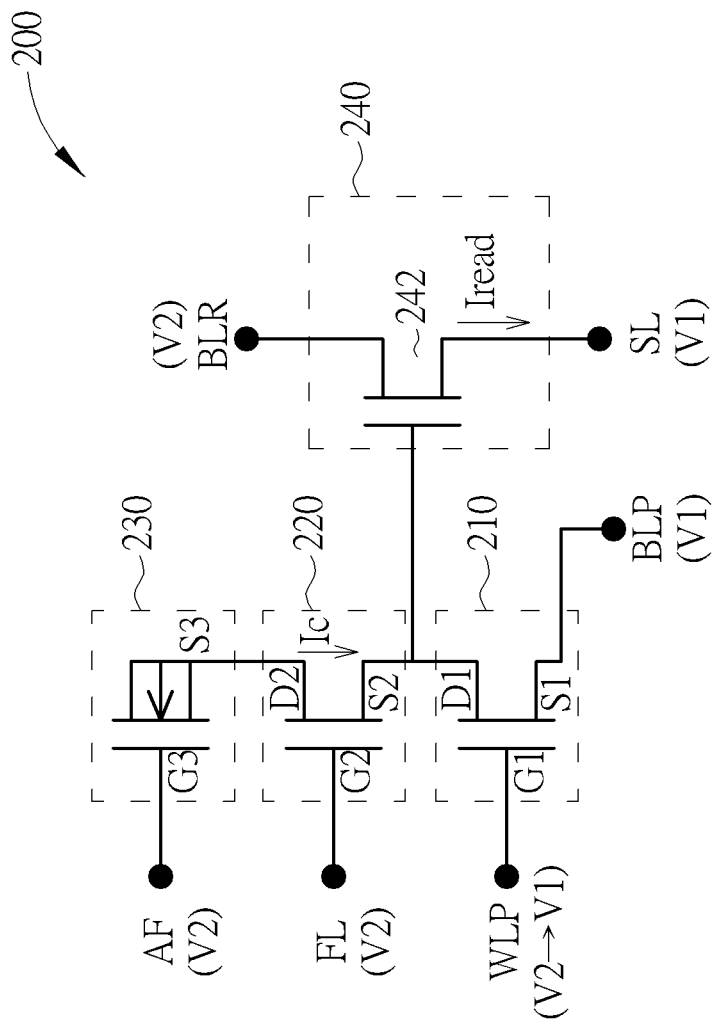
FIG. 4 shows voltage levels of control signals received by the memory array in FIG. 2 during a reading operation of the selected first memory cell according to one embodiment of the present invention.

FIG. 4 shows the memory cell 200 with the voltage levels of the bit line program signal BLP, the word line program signal WLP, the following control signal FL, the antifuse control signal AF, the bit line read signal BLR, and the selection signal SL during the reading operation of the memory cell 200.

During the reading operation of the memory cell 200, the bit line program signal BLP may be at a first voltage V1, the following control signal FL may be at a second voltage V2, the antifuse control signal AF may be at the second voltage V2, the bit line read signal BLR may be at the second voltage V2, and the selection signal SL may be at the first voltage V1. The first voltage V1 may be a system low voltage such as ground voltage and the second voltage may be a system high voltage that is higher than the first voltage. In some embodiments of the present invention, the first voltage V1 may be 0V, and the second voltage V2 may be 1.2V.

Consequently, during the reading operation of the memory cell 200, the following gate transistor 220 may be turned on and a charging current $I_c$ is formed according to the data stored in the antifuse varactor 230. If the data stored in the antifuse varactor 230 is logic "1", then the charging current $I_c$ may further turn on reading transistor 242 and form a read current $I_{read}$. If the data stored in the antifuse varactor 230 is logic "0", then the reading transistor 242 should not be turned on by the charging current $I_c$. Therefore, by observing the read current $I_{read}$/the logic level of the data stored in the memory cell 200 can be determined.

However, due to the displacement current between the parasitic capacitors at the control terminal of the reading transistor 242, the reading transistor 242 may be turned on even when the data stored in the memory cell 200 is logic "0". For example, if the parasitic capacitance of the reading transistor 242 at the control terminal of the reading transistor 242 is C1, the parasitic capacitance of the following gate transistor 220 at the control terminal of the reading transistor 242 is C2, the capacitance of the antifuse varactor 230 at the control terminal of the reading transistor 242 is C3, and the initial voltage level of the control terminal of the reading transistor 242 is $$\left(\frac{C_1 \times V2}{C_1 + C_2 + C_3}\right)$$

or greater, then the reading transistor 242 may finally be turned on by the displacement current even without the charging current $I_c$. In this case, the system may have to determine the logic level of the data after the read current finishes charging the parasitic capacitance of the memory cell along the column but before the reading transistor 242 is turned on by the displacement current, which may cause difficulty in the reading operation due to such a tight window of time.

Therefore, during the reading operation of the memory cell 200, the word line program signal WLP may change from the voltage V2 to the voltage V1. That is, during the reading operation of the memory cell 200, the programming selection transistor 210 may be turned on firstly to discharge the parasitic capacitors at the control terminal of the reading transistor 242, and then may be turned off. Thus, the possibility of the reading transistor 242 to be turned on unintentionally can be reduced.

Figure 5:
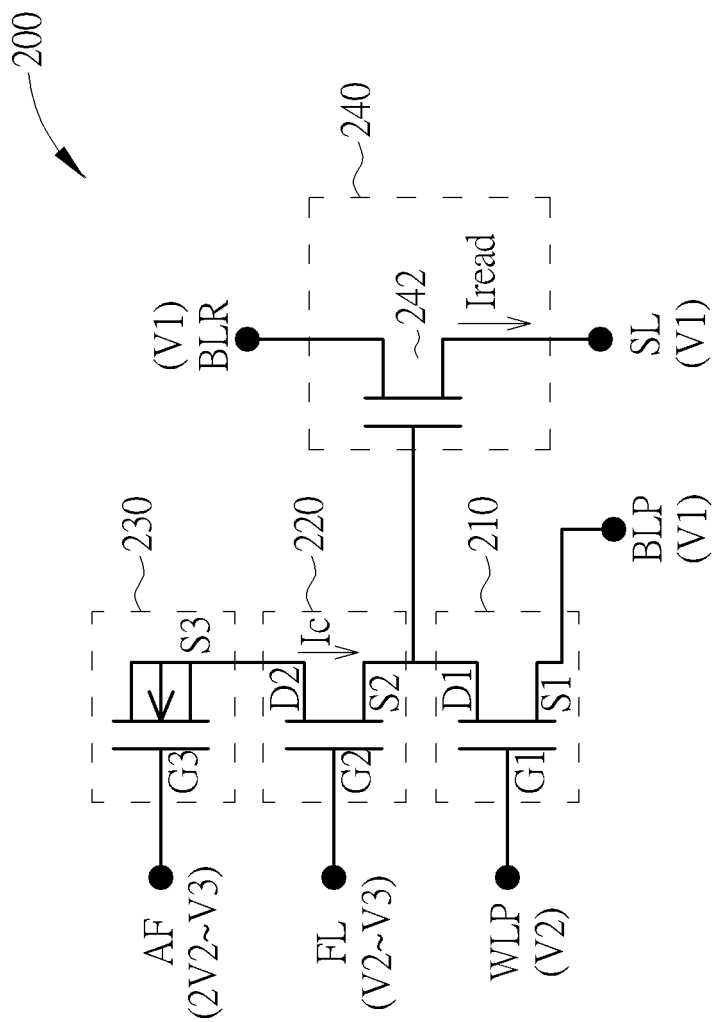
FIG. 5 shows voltage levels of control signals received by the memory array in FIG. 2 during a programming operation of the selected first memory cell according to one embodiment of the present invention.

FIG. 5 shows the memory cell 200 with the voltage levels of the bit line program signal BLP, the word line program signal WLP, the following control signal FL, the antifuse control signal AF, the bit line read signal BLR, and the selection signal SL during a programming operation of the memory cell 200.

During the programming operation of the memory cell 200, the bit line program signal BLP may be at the first voltage V1, the word line program signal WLP may be at the second voltage V2, the following control signal FL may be at a voltage level between the second voltage V2 and a third voltage V3, the antifuse control signal AF may be at a voltage level between two times of the second voltage V2, 2×V2, and the third voltage V3, and better to be at the third voltage V3. The third voltage V3 is higher than the second voltage V2. In some embodiments of the present invention, the third voltage V3 may be three to five times the second voltage V2, and the following control signal FL may be at a voltage level of $$\frac{V3}{3}, \frac{V3}{2} \text{ or } 2 \times V2.$$

For example, the following control signal FL may be at a voltage level of 2.5V while the third voltage V3 may be 6V and the second voltage V2 may be 1.2V.

Consequently, the programming selection transistor 210 and the following gate transistor 220 may be turned on, and the antifuse varactor 230 will be ruptured by a high voltage difference during the programming operation of the memory cell 200. Also, the bit line read signal BLR and the selection signal SL may both be at the first voltage V1 during the programming operation of the memory cell 200.

Since the charging current $I_c$ only has to trigger the reading circuit 240 to form the read current $I_{read}$, the issue that the small charging current formed by the antifuse varactor 230 may be decayed by the long charging path can be solved. In addition, since the read current $I_{read}$ is formed by the turned on reading transistor 242, the read current may be greater than the charging current $I_c$ formed by the antifuse varactor 230 so the time for reading data from the memory cell 200 may be further shortened.

Figure 6:
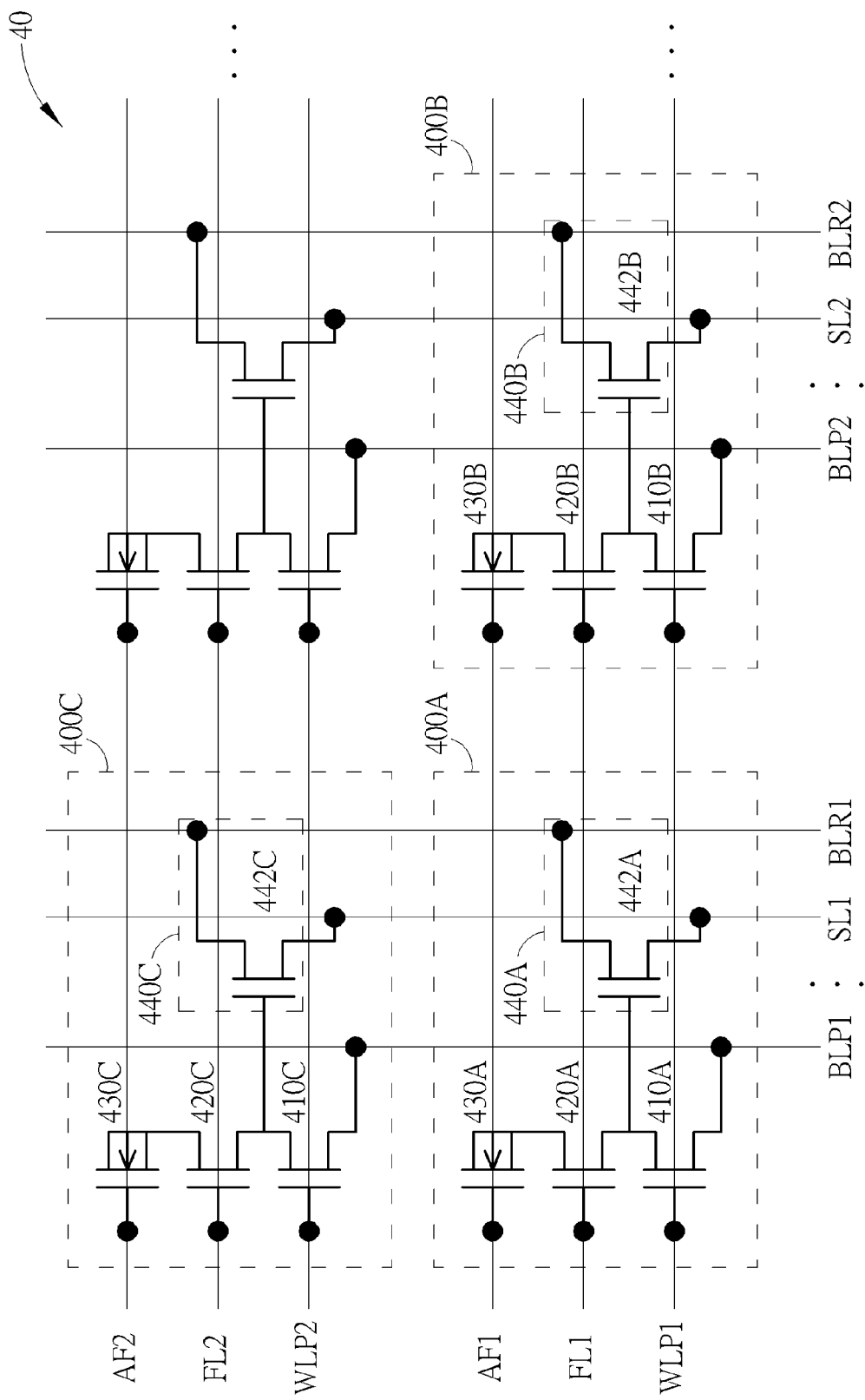
FIG. 6 shows a memory array according to one embodiment of the present invention.

FIG. 6 shows a memory array 40 according to one embodiment of the present invention. The memory array 40 may include a first memory cell 400A and a second memory cell 400B. The memory cells 400A and 400B are in the same row (within the same word) of the memory array 40, that is, the first memory cell 400A and the second memory cell 400B may store different bits of a word in the memory array 40. Furthermore, the first memory cell 400A and the second memory cell 400B may have the same structure as the memory cell 200.

The first memory cell 400A may include a first programming selection transistor 410A, a first following gate transistor 420A, a first antifuse varactor 430A, and a first reading circuit 440A. The first programming selection transistor 410A may have a first terminal, a second terminal for receiving a first bit line program signal BLP1, and a control terminal for receiving a first word line program signal WLP1. The first following gate transistor 420A may have a first terminal, a second terminal coupled to the first terminal of the first programming selection transistor 410A, and a control terminal for receiving a first following control signal FL1. The first antifuse varactor 430A may have a first terminal for receiving a first antifuse control signal AF1, and a second terminal coupled to the first terminal of the first following gate transistor 420A. The first reading circuit 440A may include a first reading transistor 442A having a first terminal for receiving a first bit line read signal BLR1, a second terminal for receiving a first selection signal SL1, and a control terminal coupled to the second terminal of the first following gate transistor 420A.

The second memory cell 400B may include a second programming selection transistor 410B, a second following gate transistor 420B, a second antifuse varactor 430B, and a second reading circuit 440B. The second programming selection transistor 410B may have a first terminal, a second terminal for receiving a second bit line program signal BLP2, and a control terminal coupled to the control terminal of the first programming selection transistor 410A. The second following gate transistor 420B may have a first terminal, a second terminal coupled to the first terminal of the second programming selection transistor 410B, and a control terminal coupled to the control terminal of the first following gate transistor 420A. The second antifuse varactor 430B may have a first terminal coupled to the first terminal of the first antifuse varactor 430A, and a second terminal coupled to the first terminal of the second following gate transistor 420B. The second reading circuit 440B may comprise a first reading transistor 442B having a first terminal for receiving a second bit line read signal BLR2, a second terminal for receiving a second selection signal SL2, and a control terminal coupled to the second terminal of the second following gate transistor 420B.

Figure 7:
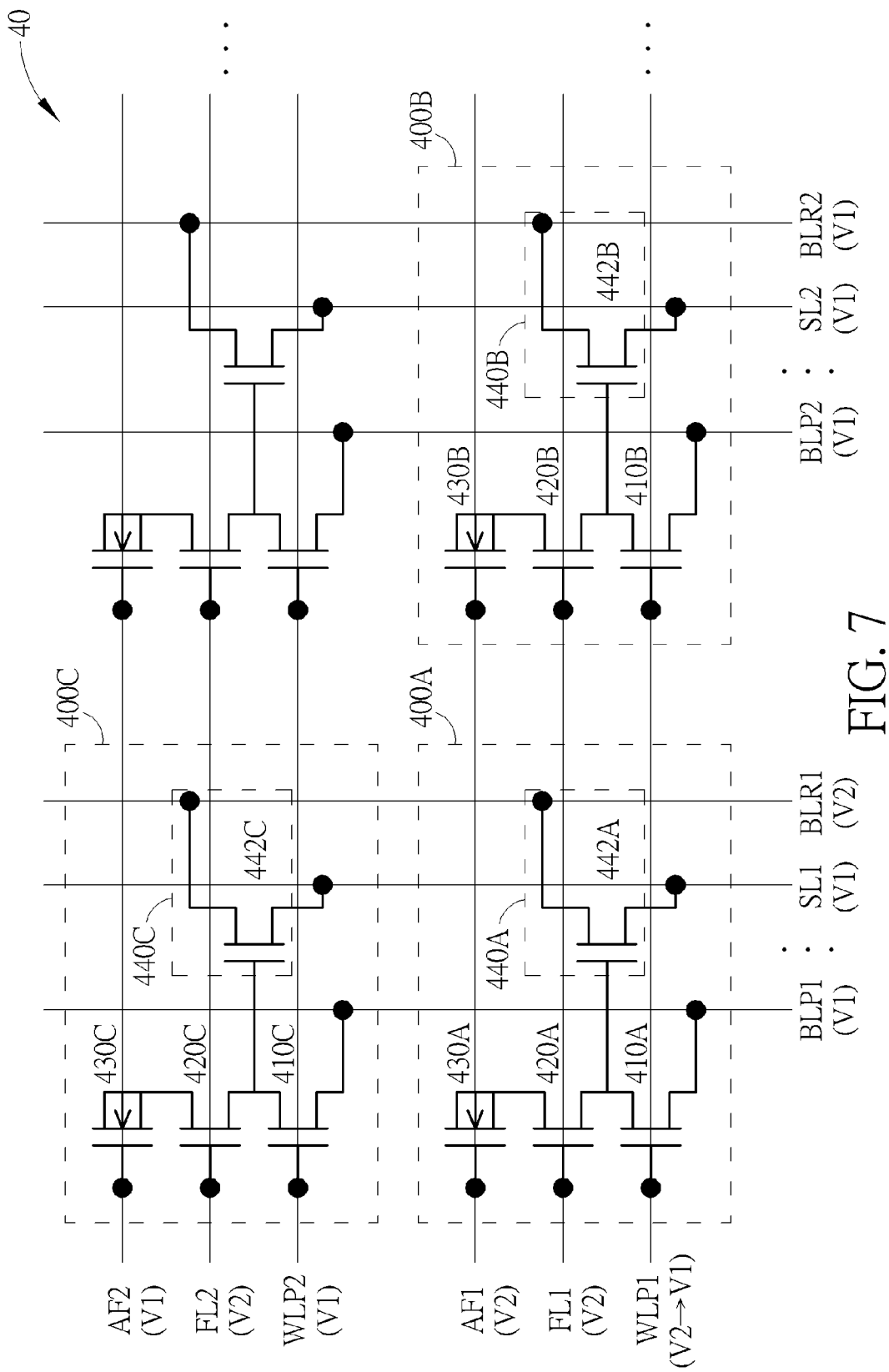
FIG. 7 shows voltage levels of control signals received by the memory array in FIG. 6 during a reading operation of the selected first memory cell according to one embodiment of the present invention.

The first memory cell 400A may be operated with the same principle as the memory cell 200. FIG. 7 shows the memory array 40 with the voltage levels of the control signals received by the memory array 40 during a reading operation of the selected first memory cell 400A.

During the reading operation of the first memory cell 400A, the first bit line program signal BLP1 may be at the first voltage V1, the first word line program signal WLP1 may change from a second voltage V2 to the first voltage V1, the first following control signal FL1 may be at the second voltage V2, the first antifuse control signal AF1 may be at the second voltage V2, the first bit line read signal BLR1 may be at the second voltage V2, and the first selection signal SL1 may be at the first voltage V1.

However, since the memory cells 400A and 400B are in the same row (within the same word) of the memory array 40, the memory cells 400A and 400B may receive the same signals of the first word line program signal WLP1, the first following control signal FL1, and the first antifuse control signal AF1. To prevent the second memory cell 400B from outputting the read current unintentionally during the reading operation of the first memory cell 400A, the second bit line program signal BLP2 may be at the first voltage V1, the second bit line read signal BLR2 may be at the first voltage V1, and the second selection signal SL2 may be at the first voltage V1 so that no read current will be formed by the second reading transistor 442B during the reading operation of the first memory cell 400A.

Figure 8:
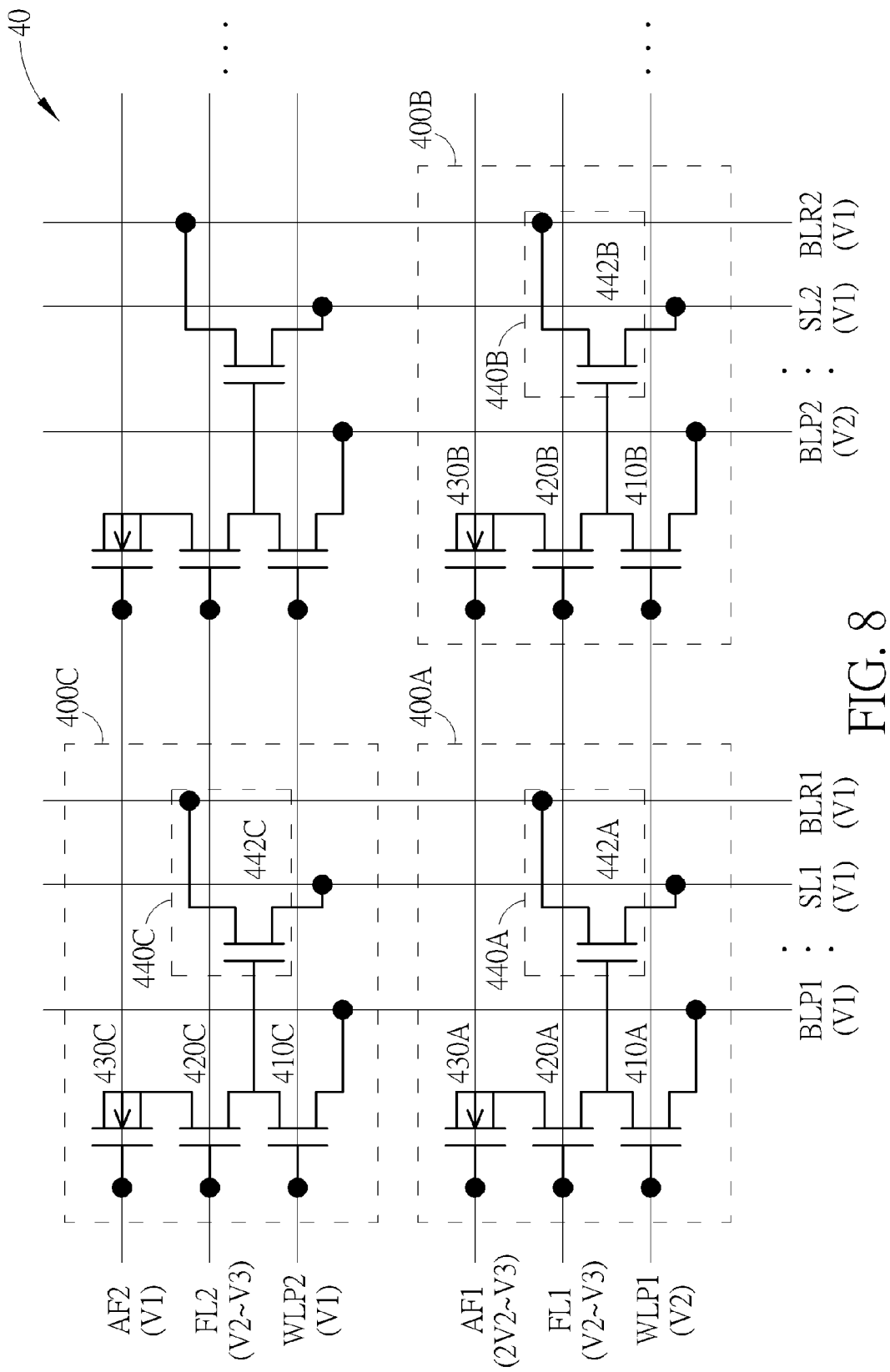
FIG. 8 shows voltage levels of control signals received by the memory array in FIG. 6 during a programming operation of the selected first memory cell according to one embodiment of the present invention.

Furthermore, FIG. 8 shows the voltage levels of the control signals received by the memory array 40 during a programming operation of the selected first memory cell 400A. During the programming operation of the first memory cell 400A, the first bit line program signal BLP1 may be at the first voltage V1, the first word line program signal WLP1 may be at the second voltage V2, the first following control signal FL1 may be at a voltage level between the second voltage V2 and the third voltage V3, such as $$\frac{V3}{3}, \frac{V3}{2}, \text{ or } 2 \times V2.$$

The first antifuse control signal AF1 may be at a voltage between two times of the second voltage V2, 2×V2, and the third voltage V3, and better to be at the third voltage V3. The second bit line program signal BLP2 may be at the second voltage V2. Since the second bit line program signal BLP2 may be at the second voltage V2, the second memory cell 400B will not be written during the programming operation of the first memory cell 400A.

In FIG. 6, the memory array 40 may further include a third memory cell 400C disposed at the same column as the first memory cell 400A, that is, the first memory cell 400A and the third memory cell 400C may belong to different words in the memory array 40. The third memory cell 400C may include a third programming selection transistor 410C, a third following gate transistor 420C, a third antifuse varactor 430C, and a third reading circuit 440C. The third programming selection transistor 410C may have a first terminal, a second terminal coupled to the second terminal of the first programming selection transistor 410A, and a control terminal for receiving a second word line program signal WLP2. The third following gate transistor 420C may have a first terminal, a second terminal coupled to the first terminal of the third programming selection transistor 410C, and a control terminal for receiving a second following control signal FL2. The third antifuse varactor 430C may have a first terminal for receiving a second antifuse control signal AF2, and a second terminal coupled to the first terminal of the third following gate transistor 420C. The third reading circuit 440C may include a third reading transistor 442C having a first terminal coupled to the first terminal of the first reading transistor 442A, a second terminal coupled to the second terminal of the first reading transistor 442A, and a control terminal coupled to the second terminal of the third following gate transistor 420C.

To prevent the third memory cell 400C from outputting the read current unintentionally during the reading operation of the first memory cell 400A as shown in FIG. 7, the second word line program signal WLP2 may be at the first voltage V1, the second following control signal FL2 may be at the second voltage V2, and the second antifuse control signal AF2 may be at the first voltage V1 during the reading operation of the first memory cell 400A. Since the second antifuse control signal AF2 may be at the first voltage V1, the third memory cell 400C will not output the read current during the reading operation of the first memory cell 400A.

Also, during the programming operation of the first memory cell 400A as shown in FIG. 8, the second word line program signal WLP2 may be at the first voltage V1, the second following control signal FL2 may be at a voltage level between the second voltage V2 and half of the third voltage V3, $$\frac{V3}{2}.$$

The second antifuse control signal AF2 may be at the first voltage V1. Since the third programming selection transistor 410C may be turned off by the second word line program signal WLP2 and the second antifuse control signal AF2 may be at the first voltage V1, the third memory cell 400C will not be written during the programming operation of the first memory cell 400A. Also, in some embodiments of the present invention, the first bit line read signal BLR1, the first selection signal SL1, the second bit line read signal BLR2, and the second selection signal SL2 may all be at the first voltage V1 during the programming operation of the memory cell 400A. Although the memory array 40 in FIG. 6 shows memory cells 400A, 400B, and 400C for purpose of convenience, the present invention is not limited to having two memory cells in a word and two words. In other embodiments of the present invention, the memory array 40 may have other numbers of memory cells in the same word and may have other numbers of words.

In addition, in some embodiments of the present invention, switching of high voltage control signal such as the antifuse control signal may require greater circuit area and may be undesirable. Therefore, a reading selection transistor may be applied to the reading circuit of the memory cell to solve this issue.

Figure 9:
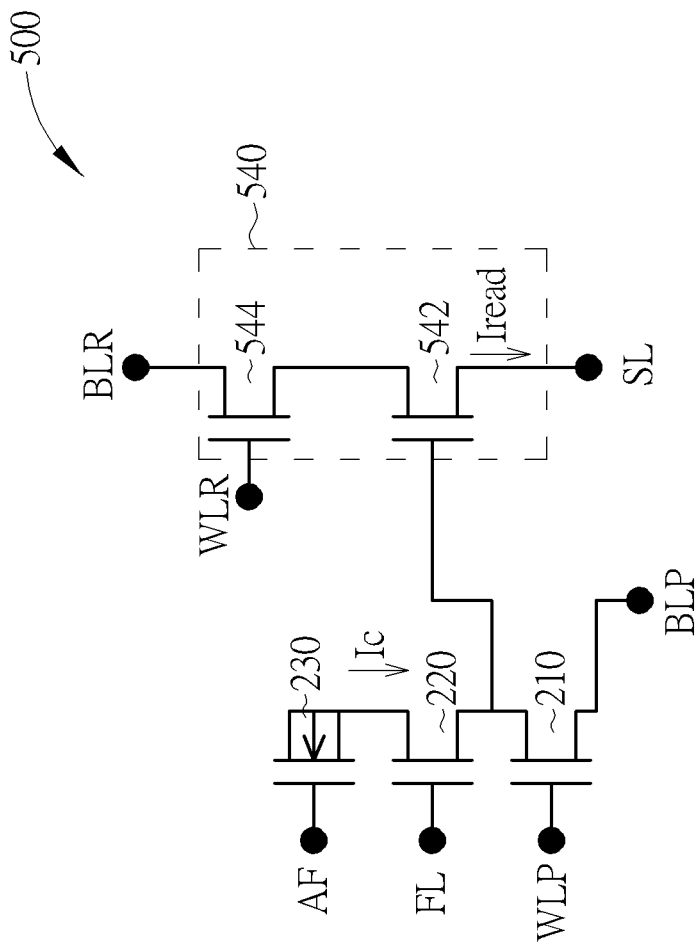
FIG. 9 shows a memory cell according to another embodiment of the present invention.

FIG. 9 shows a memory cell 500 for low voltage operations according to one embodiment of the present invention. The memory cell 500 includes a programming selection transistor 210, a following gate transistor 220, an antifuse varactor 230, and a reading circuit 540. The reading circuit 540 may include a reading transistor 542 and a reading selection transistor 544. The reading transistor 542 may have a first terminal, a second terminal for receiving the selection signal SL, and a control terminal coupled to the second terminal of the following gate transistor 220. The reading selection transistor 544 may have a first terminal for receiving the bit line read signal BLR, a second terminal coupled to the first terminal of the reading transistor 542, and a control terminal for receiving a word line read signal WLR.

The reading operation of the memory cell 500 may follow the similar principle as the reading operation of the memory cell 200 with the word line read signal WLR to be at the second voltage V2. That is, the reading selection transistor 544 must be turned on so that the reading circuit 540 is able to output the read current $I_{read}$. In this case, the word line read signal WLR may be used to select the proper memory cell to output the read current so that the need for switching the antifuse control signal AF can be saved.

Figure 10:
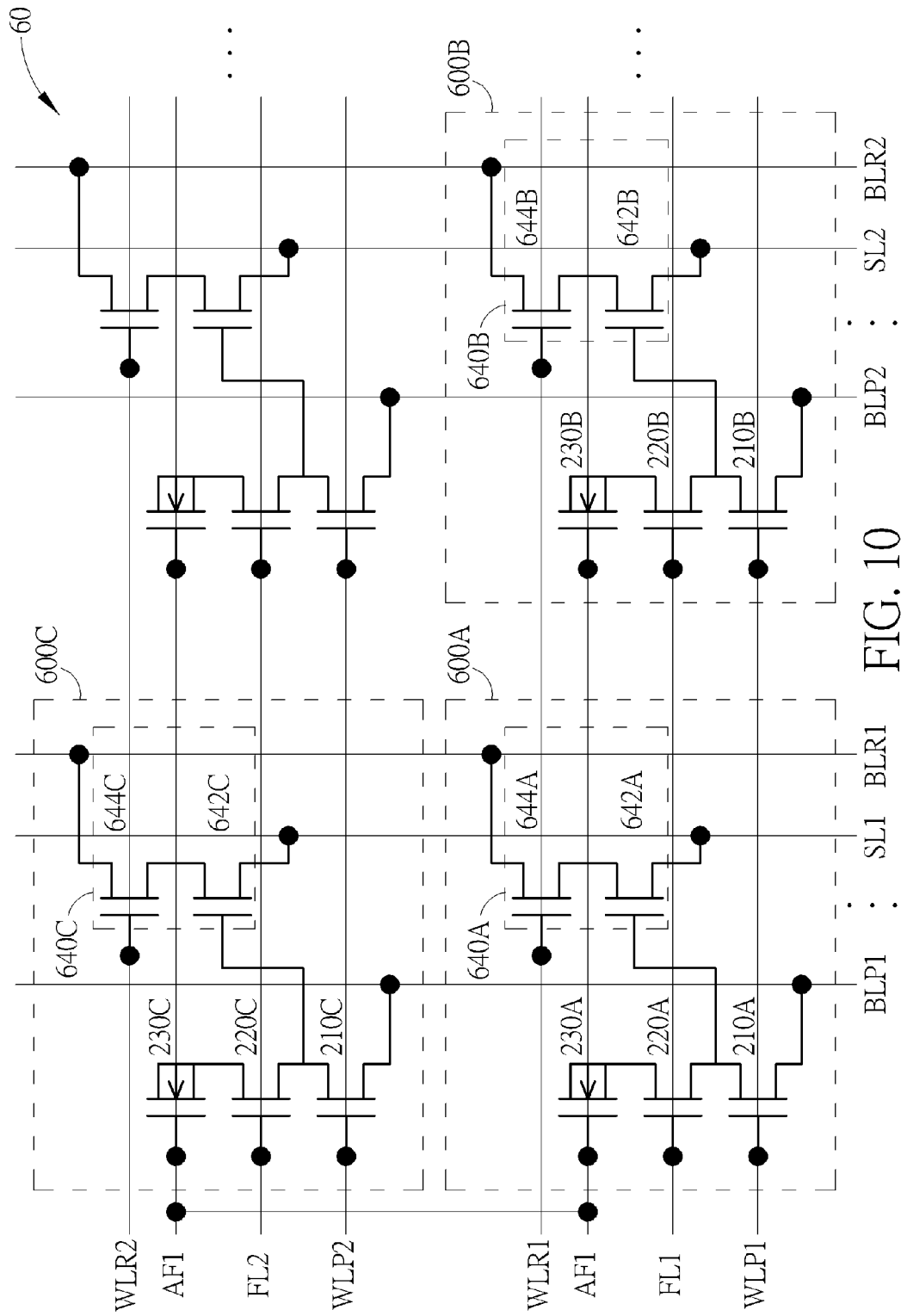
FIG. 10 shows a memory array according to another embodiment of the present invention.

FIG. 10 shows a memory array 60 according to one embodiment of the present invention. The memory array 60 may have a similar structure and operating principles as the memory array 40. The difference is that each of the first, second and third memory cells 600A, 600B and 600C has the same structure as the memory cell 500 instead of the memory cell 200, and all the memory cells 600A, 600B and 600C may share the same first antifuse control signal AF1, that is, the first terminal of the first antifuse varactor 230A, the first terminal of the second antifuse varactor 230B, and the first terminal of the third antifuse varactor 230C may all be coupled together for receiving the first antifuse control signal AF1.

The first reading circuit 640A may include a first reading transistor 642A and a first reading selection transistor 644A. The first reading transistor 642A may have a first terminal, a second terminal for receiving the first selection signal, and a control terminal coupled to the second terminal of the first following gate transistor 220A. The first reading selection transistor 644A may have a first terminal for receiving the first bit line read signal BLR1, a second terminal coupled to the first terminal of the first reading transistor 642A, and a control terminal for receiving a first word line read signal WLR1.

The second reading circuit 640B may include a second reading transistor 642B and a second reading selection transistor 644B. The second reading transistor 642B may have a first terminal, a second terminal for receiving the second selection signal SL2, and a control terminal coupled to the second terminal of the second following gate transistor 220B. The second reading selection transistor 644B may have a first terminal for receiving the second bit line read signal BLR2, a second terminal coupled to the first terminal of the second reading transistor 642B, and a control terminal for receiving the first word line read signal WLR1.

The third reading circuit 640C may include a third reading transistor 642C and a third reading selection transistor 644C. The third reading transistor 642C may have a first terminal, a second terminal coupled to the second terminal of the first reading transistor 642A, and a control terminal coupled to the second terminal of the third following gate transistor 220C. The third reading selection transistor 644C may have a first terminal for receiving the first bit line read signal BLR1, a second terminal coupled to the first terminal of the third reading transistor 642C, and a control terminal for receiving a second word line read signal WLR2.

The first memory cell 600A may be operated with the similar principle as the memory cell 400A. That is, during the reading operation of the first memory cell 600A, the signals received by the memory cell 600A, 600B and 600C may be at the same levels as shown in FIG. 7. However, since the memory cell 600A, 600B and 600C all receive the same first antifuse control signal AF1, the first word line read signal WLR1 may be at the second voltage V2 and the second word line read signal WLR2 may be at the first voltage V1 so that the first reading selection transistor 644A can be turned on to output the read current $I_{read}$ while the third reading selection transistor 644C can be turned off during the reading operation of the first memory cell 600A.

Furthermore, during a programming operation of the first memory cell 600A, the signals received by the memory cell 600A, 600B and 600C may be at the same levels as shown in FIG. 8 and with the first word line read signal WLR1 at the first voltage V1 and the second word line read signal WLR2 at the first voltage V1.

Consequently, all the memory cells in the memory array 60 may use the same antifuse control signal without interfering with the reading operation of each memory cell and the circuit area can be saved.

Figure 11:
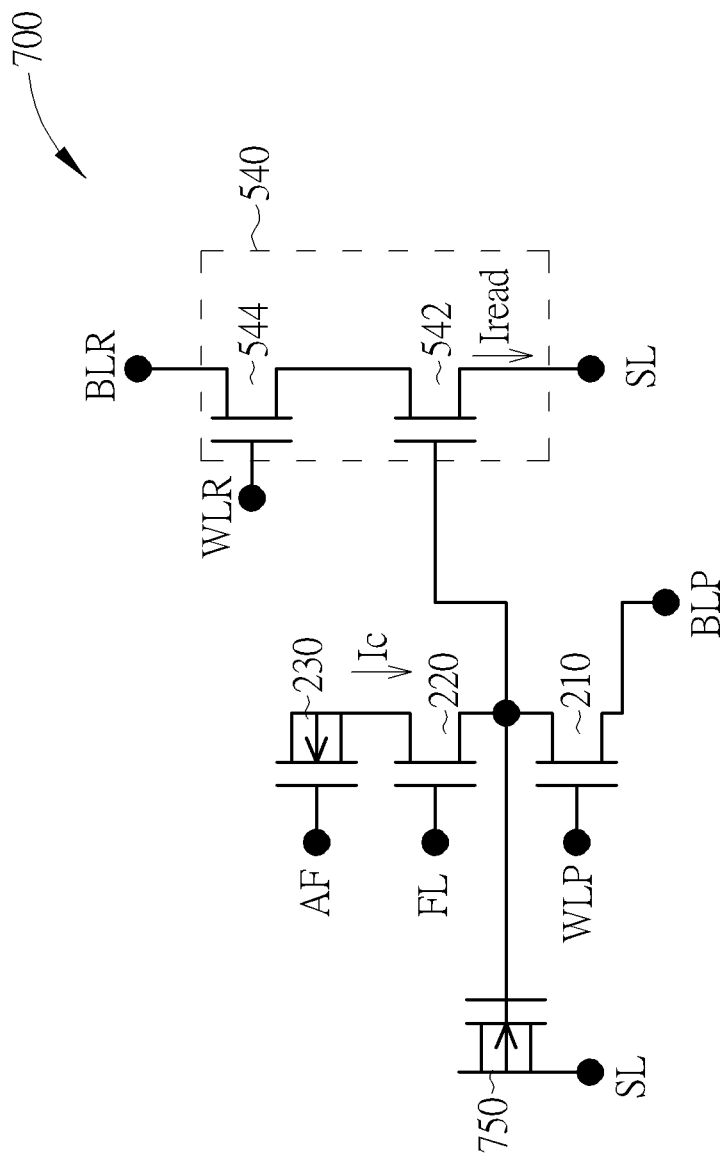
FIG. 11 shows a memory cell according to another embodiment of the present invention.

In some embodiments of the present invention, a buffer varactor may be added to the memory cell to further avoid the displacement current to turn on the reading transistor unintentionally. FIG. 11 shows a memory cell 700 according to one embodiment of the present invention. The memory cell 700 may have the same structure as the memory cell 500, however, the difference between the two is that the memory cell 700 may further include a buffering varactor 750 having a first terminal coupled to the second terminal of the following gate transistor 220 and a second terminal for receiving the selection signal SL.

By adding the buffering varactor 750, the effect of the displacement current may further be reduced because the buffering varactor 750 may help to store the charges stored in other parasitic capacitors and reduce the voltage level of the control terminal of the reading transistor 542. In addition, the greater the capacitance of the buffering varactor 750 is, the lower the voltage level of the control terminal of the reading transistor 542 is and it is less likely to turn on the reading transistor unintentionally. Consequently, the window of time for the system to read the logic level of data can be further widened. However, large capacitance of the buffering varactor 750 may increase the time for the charging current to turn on the reading transistor if the logic level of bit is "1". Therefore, a proper value of capacitance of the buffering varactor 750 should be considered to fit the system requirement.

In summary, according to the embodiments of the present invention, the memory cells and memory array are able to shorten the time for reading data from the memory cell by using the reading circuit to form a stable read current, and are able to widen the window of time for reading data from the memory cell by discharging the parasitic capacitance in the beginning of the reading operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A memory cell comprising:
   a programming selection transistor having a first terminal, a second terminal configured to receive a bit line program signal, and a control terminal configured to receive a word line program signal;

a following gate transistor having a first terminal, a second terminal coupled to the first terminal of the programming selection transistor, and a control terminal configured to receive a following control signal;

an antifuse element having a first terminal configured to receive an antifuse control signal, and a second terminal coupled to the first terminal of the following gate transistor; and a reading circuit coupled to the second terminal of the following gate transistor and configured to form a read current according to a bit line read signal and a selection signal during a reading operation of the memory cell.

2. The memory cell of claim 1, wherein during the reading operation of the memory cell, the bit line program signal is at a first voltage, the word line program signal changes from a second voltage to the first voltage, the following control signal is at the second voltage, the antifuse control signal is at the second voltage, the bit line read signal is at the second voltage, the selection signal is at the first voltage, and the second voltage is higher than the first voltage.

3. The memory cell of claim 1, wherein the reading circuit comprises a reading transistor having a first terminal configured to receive the bit line read signal, a second terminal configured to receive the selection signal, and a control terminal coupled to the second terminal of the following gate transistor.

4. The memory cell of claim 1, wherein during a programming operation of the memory cell, the bit line program signal is at the first voltage, the word line program signal is at the second voltage, the following control signal is at a voltage level between the second voltage and a third voltage, the antifuse control signal is at the third voltage, and the third voltage is higher than the second voltage.

5. The memory cell of claim 1, wherein the reading circuit comprises:

a reading transistor a having a first terminal, a second terminal configured to receive the selection signal, and a control terminal coupled to the second terminal of the following gate transistor; and a reading selection transistor having a first terminal configured to receive the bit line read signal, a second terminal coupled to the first terminal of the reading transistor, and a control terminal configured to receive a word line read signal;

wherein during the reading operation of the memory cell, the word line read signal is at the second voltage.

6. The memory cell of claim 5, wherein during a programming operation of the memory cell, the bit line program signal is at the first voltage, the word line program signal is at the second voltage, the following control signal is at a voltage level between the second voltage and a third voltage, the antifuse control signal is at the third voltage, the word line read signal is at the first voltage, and the third voltage is higher than the second voltage.

7. The memory cell of claim 1, wherein the antifuse element is a varactor.

8. The memory cell of claim 7, wherein the varactor is a metal oxide semiconductor transistor having a source/drain extension area formed between a source of the metal oxide semiconductor transistor and a drain of metal oxide semiconductor transistor and the source/drain extension area for shorting the source and the drain of the metal oxide semiconductor transistor.

9. The memory cell of claim 1, further comprising a buffer varactor having a first terminal coupled to the second terminal of the following gate transistor and a second terminal configured to receive the selection signal.

10. The memory cell of claim 1, wherein the following gate transistor is implemented by a native device, a short channel device or a varactor.

11. A memory array comprising:

a first memory cell comprising:

a first programming selection transistor having a first terminal, a second terminal configured to receive a first bit line program signal, and a control terminal configured to receive a first word line program signal;

a first following gate transistor having a first terminal, a second terminal coupled to the first terminal of the first programming selection transistor, and a control terminal configured to receive a first following control signal;

a first antifuse element having a first terminal configured to receive a first antifuse control signal, and a second terminal coupled to the first terminal of the first following gate transistor; and a first reading circuit coupled to the second terminal of the first following gate transistor and configured to form a first read current according to a first bit line read signal and a first selection signal during a reading operation of the first memory cell; and a second memory cell comprising:

a second programming selection transistor having a first terminal, a second terminal configured to receive a second bit line program signal, and a control terminal coupled to the control terminal of the first programming selection transistor;

a second following gate transistor having a first terminal, a second terminal coupled to the first terminal of the second programming selection transistor, and a control terminal coupled to the control terminal of the first following gate transistor;

a second antifuse element having a first terminal coupled to the first terminal of the first antifuse element, and a second terminal coupled to the first terminal of the second following gate transistor; and a second reading circuit coupled to the second terminal of the second following gate transistor and configured to form a second read current according to a second bit line read signal and a second selection signal during a reading operation of the second memory cell.

12. The memory array of claim 11, wherein:

the first reading circuit comprises a first reading transistor having a first terminal configured to receive the first bit line read signal, a second terminal configured to receive the first selection signal, and a control terminal coupled to the second terminal of the first following gate transistor; and the second reading circuit comprises a first reading transistor having a first terminal configured to receive the second bit line read signal, a second terminal configured to receive the second selection signal, and a control terminal coupled to the second terminal of the second following gate transistor.

13. The memory array of claim 12, further comprising a third memory cell comprising:

a third programming selection transistor having a first terminal, a second terminal coupled to the second terminal of the first programming selection transistor, and a control terminal configured to receive a second word line program signal;

a third following gate transistor having a first terminal, a second terminal coupled to the first terminal of the third programming selection transistor, and a control terminal configured to receive a second following control signal;

a third antifuse element having a first terminal configured to receive a second antifuse control signal, and a second terminal coupled to the first terminal of the third following gate transistor; and a third reading circuit comprising a third reading transistor having a first terminal coupled to the first terminal of the first reading transistor, a second terminal coupled to the second terminal of the first reading transistor, and a control terminal coupled to the second terminal of the third following gate transistor.

14. The memory array of claim 13, wherein during the reading operation of the first memory cell, the first bit line program signal is at a first voltage, the first word line program signal changes from a second voltage to the first voltage, the first following control signal is at the second voltage, the first antifuse control signal is at the second voltage, the first bit line read signal is at the second voltage, the first selection signal is at the first voltage, the second bit line program signal is at the first voltage, the second bit line read signal is at the first voltage, the second selection signal is at the first voltage, and the second voltage is higher than the first voltage.

15. The memory array of claim 14, wherein during a programming operation of the first memory cell, the first bit line program signal is at the first voltage, the first word line program signal is at the second voltage, the first following control signal is at a voltage level between the second voltage and a third voltage, the first antifuse control signal is at the third voltage, the second bit line program signal is at the second voltage, and the third voltage is higher than the second voltage.

16. The memory array of claim 15, wherein during a programming operation of the first memory cell, the second word line program signal is at a first voltage, the second following control signal is at a voltage level between a second voltage and a third voltage, and the second antifuse control signal is at the first voltage.

17. The memory array of claim 14, wherein during the reading operation of the first memory cell, the second word line program signal is at the first voltage, the second following control signal is at the second voltage, and the second antifuse control signal is at the first voltage.

18. The memory array of claim 11, wherein:
the first reading circuit comprises:
a first reading transistor having a first terminal, a second terminal configured to receive the first selection signal, and a control terminal coupled to the second terminal of the first following gate transistor; and
a first reading selection transistor having a first terminal configured to receive the first bit line read signal, a second terminal coupled to the first terminal of the first reading transistor, and a control terminal configured to receive a first word line read signal; and
the second reading circuit comprises:
a second reading transistor having a first terminal, a second terminal configured to receive the second selection signal, and a control terminal coupled to the second terminal of the second following gate transistor; and
a second reading selection transistor having a first terminal configured to receive the second bit line read signal, a second terminal coupled to the first terminal of the second reading transistor, and a control terminal configured to receive the first word line read signal.

19. The memory array of claim 18, further comprising a third memory cell comprising:

a third programming selection transistor having a first terminal, a second terminal coupled to the second terminal of the first programming selection transistor, and a control terminal configured to receive a second word line program signal;

a third following gate transistor having a first terminal, a second terminal coupled to the first terminal of the third programming selection transistor, and a control terminal configured to receive a second following control signal;

a third antifuse element having a first terminal coupled to the first terminal of the first antifuse element, and a second terminal coupled to the first terminal of the third following gate transistor; and a third reading circuit comprising:
a third reading transistor having a first terminal, a second terminal coupled to the second terminal of the first reading transistor, and a control terminal coupled to the second terminal of the third following gate transistor; and
a third reading selection transistor having a first terminal coupled to the first terminal of the first reading selection transistor, a second terminal coupled to the first terminal of the third reading transistor, and a control terminal configured to receive a second word line read signal.

20. The memory array of claim 19, wherein during the reading operation of the first memory cell, the first bit line program signal is at a first voltage, the first word line program signal changes from a second voltage to the first voltage, the first following control signal is at the second voltage, the first antifuse control signal is at the second voltage, the first bit line read signal is at the second voltage, the first word line read signal is at the second voltage, the first selection signal is at the first voltage, the second bit line program signal is at the first voltage, the second bit line read signal is at the first voltage, the second selection signal is at the first voltage, the second word line program signal is at the first voltage, the second following control signal is at the second voltage, and the second word line read signal is at the first voltage, and the second voltage is higher than the first voltage.

21. The memory array of claim 20, wherein during a programming operation of the first memory cell, the first bit line program signal is at the first voltage, the first word line program signal is at the second voltage, the first following control signal is at a voltage level between the second voltage and a third voltage, the first antifuse control signal is at the third voltage, the second bit line program signal is at the second voltage, the second word line program signal is at the first voltage, and the second following control signal is at a voltage level between the second voltage and the third voltage, and the third voltage is higher than the second voltage.

22. The memory array of claim 11, wherein each of the first, second and third antifuse elements is a metal oxide semiconductor transistor having a source/drain extension area formed between a source of the metal oxide semiconductor transistor and a drain of metal oxide semiconductor transistor and the source/drain extension area for shorting the source and the drain of the metal oxide semiconductor transistor.

23. The memory array of claim 11, wherein the first memory cell further comprises a buffering varactor having a first terminal coupled to the second terminal of the first following gate transistor and a second terminal configured to receive the first selection signal.

24. The memory cell of claim 11, wherein each of the first, second and third following gate transistors are implemented by a native device, a short channel device or a varactor.

* * * * *